US007236008B1

United States Patent
Cliff et al.

(10) Patent No.: US 7,236,008 B1
(45) Date of Patent: Jun. 26, 2007

(54) MULTIPLE SIZE MEMORIES IN A PROGRAMMABLE LOGIC DEVICE

(75) Inventors: Richard G. Cliff, Los Altos, CA (US); Srinivas T. Reddy, Fremont, CA (US); Andy L. Lee, San Jose, CA (US); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/611,122

(22) Filed: Dec. 14, 2006

Related U.S. Application Data (63) Continuation-in-part of application No. 10/787,818, filed on Feb. 25, 2004, now Pat. No. 7,161,381, which is a continuation of application No. 10/140,311, filed on May 6, 2002, now Pat. No. 6,720,796.

(60) Provisional application No. 60/289,266, filed on May 6, 2001.

(51) Int. Cl.
*G06F 7/38* (2006.01)
*H03K 19/177* (2006.01)

(52) U.S. Cl. .............................. 326/39; 326/41; 326/47
(58) Field of Classification Search ............ 326/38–41, 326/46–47
See application file for complete search history.

(56) References Cited

U.S. PATENT DOCUMENTS 5,933,023 A * 8/1999 Young ........................ 326/40

* cited by examiner

*Primary Examiner*—Anh Q. Tran
(74) *Attorney, Agent, or Firm*—Townsend and Townsend and Crew LLP (57) ABSTRACT

Circuits, methods, and apparatus that provide integrated circuits having memories with multiple sizes. The memories may be dedicated embedded memories, or they may be distributed memories formed using memories or lookup tables in logic elements or other appropriate circuits. Configuration bits not needed by logic elements used for distributed memories can be used for data storage as well. These various memories may be combined or otherwise linked or chained together in different combinations to form larger memories of varying sizes.

20 Claims, 5 Drawing Sheets

MULTIPLE SIZE MEMORIES IN A PROGRAMMABLE LOGIC DEVICE

CROSS-REFERENCES TO RELATED APPLICATIONS

This application is a continuation-in-part of U.S. patent application Ser. No. 10/787,818, filed Feb. 25, 2004 now U.S. Pat. No. 7,161,381, which is a continuation of U.S. patent application Ser. No. 10/140,311, filed May 6, 2002, now U.S. Pat. No. 6,720,796, issued Apr. 13, 2004, which claims the benefit of U.S. provisional application No. 60/289,266, filed May 6, 2001, each of which are incorporated by reference.

BACKGROUND

The present invention generally relates to programmable logic devices with multiple sized memories, and more particularly to programmable logic devices having memories with multiple sizes where one of these memories is a distributed memory formed at least partially using logic element lookup tables.

Programmable memory devices (PLDs) typically have one standard size of embedded memory block. When a block of memory greater than the standard size is desired, these standard sized memory blocks are chained together. However, this can decrease the speed with which the memory can be accessed. When a block of memory less than the standard size is desired, a portion of the standard sized memory block is unused, resulting in an inefficient use of silicon area.

In some PLDs, instead of an embedded memory, lookup-tables may be used as distributed memory. In these PLDs, the logic elements of the PLD are used as memory rather than having distinct blocks of memory. One disadvantage to using logic elements as memory is that they can be slower than dedicated memory blocks. Additionally, the use of logic elements as memory reduces the logic capacity of the device.

Thus, what is needed are circuits, methods, and apparatus that provide PLDs and other types of integrated circuits having highly flexible memory capabilities.

SUMMARY

Accordingly, embodiments of the present invention provide PLDs and other types of integrated circuits having highly flexible memory capabilities. An exemplary embodiment of the present invention includes memories having two or more different sizes. One or more of these memories may be distributed memories formed using one or more logic element lookup tables. These memories may be linked or combined in different ways to form different sized memories.

An exemplary embodiment of the present invention provides an integrated circuit having a number of programmable logic elements (or simply, logic elements) and at least two memories, the memories having different sizes. The integrated circuit may have a number of such memories, and some may be arranged in a number of rows or columns. Some or all may have configurable widths and depths, and they may be configurable as FIFOs or other specialized memory circuits. A specific embodiment of the present invention provides an integrated circuit including three sizes of memories.

Another exemplary embodiment of the present invention provides an integrated circuit having a number of logic elements and at least two memories, the memories having different sizes, where one of the memories is a distributed memory formed using logic element lookup tables. This provides highly localized storage at the expense of the loss of one or more logic elements. In various embodiments of the present invention, only a limited number of logic elements can be configured as distributed memory, while the other logic elements cannot be configured in this way. In a specific embodiment of the present invention, each logic element includes two adaptive lookup tables. In this embodiment, one or both adaptive lookup tables can be used for a distributed memory.

In another exemplary embodiment of the present invention, the logic elements are arranged in a number of logic array blocks. Some or all of these logic array blocks can be converted to use as a memory, that is, each logic element in a logic array block is used to form a distributed memory. In this embodiment, to eliminate overhead circuitry, other logic array blocks may be arranged such that they cannot be used as distributed memory.

In various embodiments of the present invention, configuration memory locations that are not needed can also be used for data storage. For example, if a logic array block is used as a memory, its configuration memory cells are not needed and may be used for other purposes. Multiple lookup tables, and multiple configuration memory locations, if utilized, may be combined to form a larger distributed memory.

In another exemplary embodiment of the present invention, each of these memories may be linked, chained together, or otherwise combined to form different sized memories. In various embodiments of the present invention, only similar memories can be combined, though in other embodiments, different sized memories can be combined.

A specific embodiment of the present invention provides an integrated circuit having a plurality of logic elements and a number of dedicated or embedded memories, each having the same size. In this embodiment, at least some of the logic elements' lookup tables can be combined and used as distributed memories. The embedded memories can likewise be combined to form larger memories. In another exemplary embodiment, the distributed and embedded memories can be combined together to form larger memories. Other embodiments provide various numbers of two, three, four, or more sizes of memories along with the logic element lookup tables that can be used as distributed memories. In different embodiments of the present invention, these memories can be linked together in various combinations.

A better understanding of the nature and advantages of the present invention may be gained with reference to the following detailed description and the accompanying drawings. Various embodiments of the present invention may incorporate one or more of these or the other features described herein.

DESCRIPTION OF EXEMPLARY EMBODIMENTS

In order to provide a more thorough understanding of the present invention, the following description sets forth numerous specific details, such as specific configurations, parameters, and the like. It should be recognized, however, that such description is not intended as a limitation on the scope of the present invention, but is intended to provide a better description of exemplary embodiments.

Figure 1:
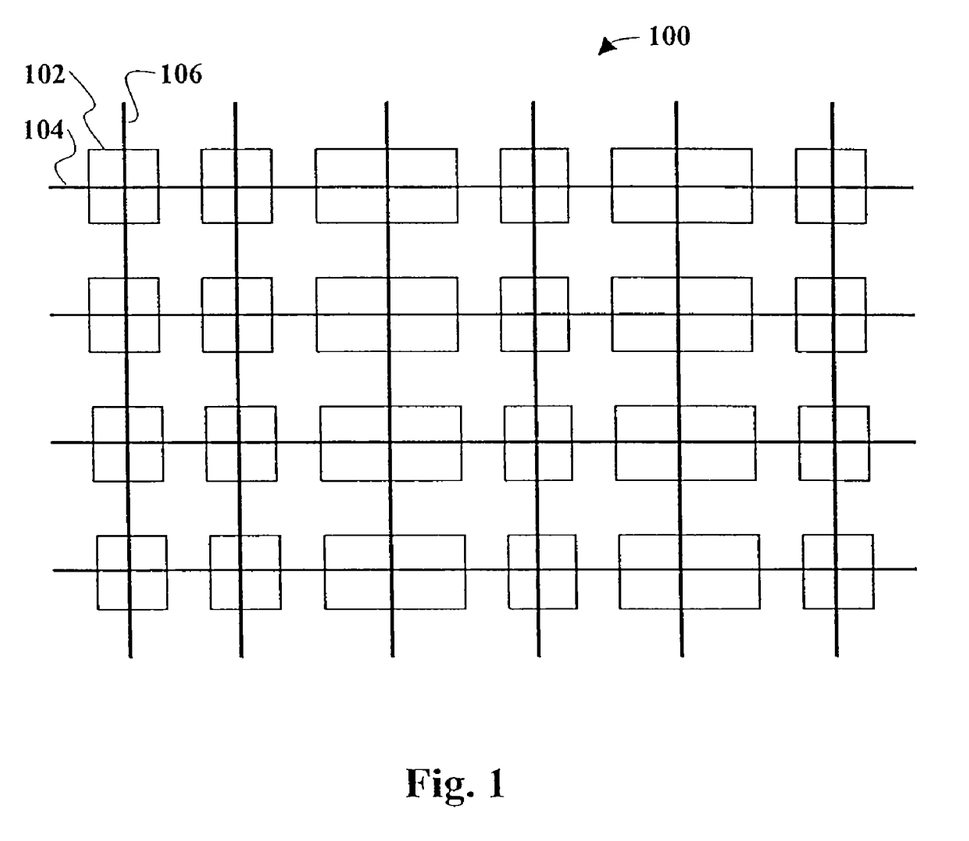
FIG. 1 is a simplified block diagram of an exemplary programmable logic device (PLD)

With reference to FIG. 1, in one exemplary embodiment, a programmable logic device (PLD) 100 includes a plurality of functional blocks arranged in columns and rows. More particularly, FIG. 1 depicts a plurality of logic array blocks (LABs) 102. Each LAB 102 includes a plurality of programmable logic resources that can be configured or programmed to perform logical functions, such as AND, OR, NOT, XOR, NAND, NOR, and the like.

Although FIG. 1 depicts a limited number of LABs 102 arranged in a particular configuration, it should be noted that PLD 100 can include any number of LABs 102 arranged in various configurations. Additionally, it should be noted that PLD 100 can include any digital logic circuit configured by an end-user, and can be known by various names or terms, such as PAL, PLA, FPLA, EPLD, CPLD, EEPLD, LCA, FPGA, and the like.

With continued reference to FIG. 1, PLD 100 includes a routing architecture that connects to each LAB 102. As depicted in FIG. 1, in the present embodiment, the routing architecture includes an array of horizontal lines ("H-lines") 104 and vertical lines ("V-lines") 106.

In one preferred embodiment, each H-line and V-line of the routing architecture includes sets of lines that span different numbers of functional blocks of PLD 100. More particularly, in the present embodiment, each H-line includes a set of H4, H8, and H24 lines that span 4, 8, and 24 functional blocks of PLD 100, respectively. In a similar fashion, each V-line includes a set of V4, V8, and V16 lines that span 4, 8, and 16 functional blocks of PLD 100, respectively. The H-lines and the V-lines can be staggered, i.e., the start and end points of each line can be offset by some number of functional blocks. Some of the H-lines can drive a signal to the right, while some can drive a signal to the left. Similarly, some of the V-lines can drive a signal upwards, while some can drive a signal downwards. For a more detailed description of the routing architecture, see co-pending U.S. patent application Ser. No. 10/057,232, titled SYSTEM AND METHOD FOR ASYMMETRIC ROUTING LINES, filed on Jan. 25, 2002, the entire content of which is incorporated herein by reference.

Figure 2:
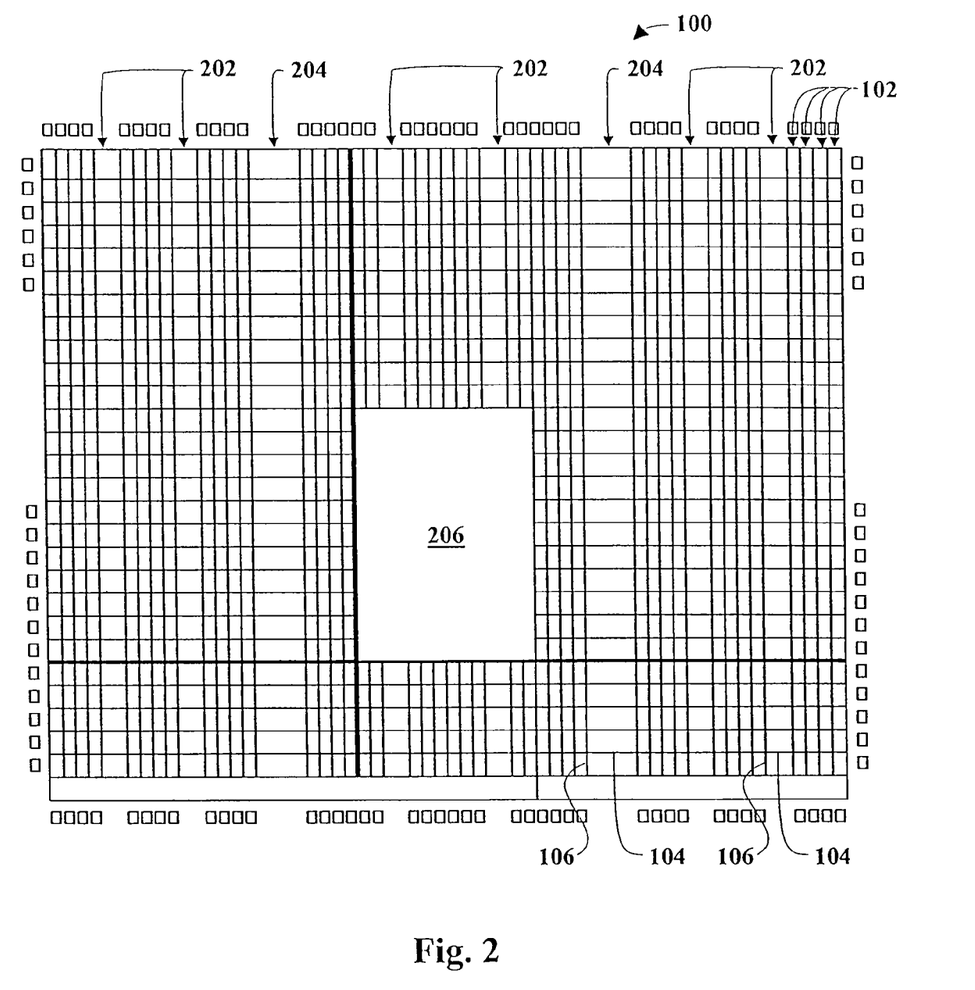
FIG. 2 is a simplified block diagram of a portion of an exemplary PLD having multiple sized embedded memory blocks.

With reference now to FIG. 2, in one exemplary embodiment, PLD 100 includes more than one distinct size of embedded memory. More particularly, in one preferred embodiment, PLD 100 includes three distinct sizes of embedded memory. As depicted in FIG. 2, the present preferred embodiment of PLD 100 includes a Small-Embedded-memory Block (SEAB) 202, a Medium-Embedded-memory Block (MEAB) 204, and a MRAM block 206, each with its own set of control logic and circuits. It should be noted that the names assigned to these different memory blocks are arbitrary and provided primarily for the sake of clarity and convenience.

In the present embodiment, SEABs 202 and MEABs 204 can have configurable depth and width down to a width of 1, with a corresponding increase in depth, which facilitates their use for a number of data rate changing applications. MRAM 206 can be configured as a block of memory in the order of about 64 Kbytes, which facilitates its use for larger amounts of on-chip data storage.

In one preferred configuration, each SEAB 202 is configured with depth and width of 32.times.18 (32 words deep and 18 bits wide) for a total of 576 bits. Each MEAB 204 is configured with depth and width of 128.times.36 (128 words deep and 36 bits wide) for a total of 4608 bits. MRAM 206 is configured with depth and width of 64K.times.9 (64 Kilobytes deep and a minimum word width of 9 bits) for a total bit count of 589824 bits. The width of the words in MRAM 206 can be increased to 144 with a corresponding decrease in depth to 4K words. As noted earlier, it should be noted that SEABs 202, MEABs 204, and MRAM 206 can be configured with various depths and width. Additionally, groups or individual SEABs 202, MEABs 204, and MRAMs 206 can be configured to have different depth and width.

Although in this preferred configuration the difference in size between SEABs 202 and MEABs 204 is relatively small in comparison to the difference between MEABs 204 and MRAM 206, it should be noted that this difference is somewhat arbitrary and can vary depending on the particular application. For example, in some applications, the difference in the sizes of SEABs 202, MEABs 204, and MRAM 206 can be proportionally even.

In one exemplary application, SEABs 202 can be used to perform functions that have relatively shallow depth of memory in comparison to MEABs 204 and MRAM 206 (i.e., fewer words can be stored at a time in SEABs 202 in comparison to MEABs 204 and MRAM 206). For example, SEABs 202 can be used to build shallow FIFOs and shift registers. SEABs 202 can also be used to store the parity information for a larger separate memory, which can make the larger memory more reliable.

MEABs 204 can be used to perform larger depth and width functions than SEABs 202. For example, MEABs 204 can also be used to build larger FIFOs and shift registers than SEAB 202. Additionally, the larger width of MEABs 204 can support more parallel inputs into the memory.

MRAM 206 can be used for larger amounts of on-chip data storage than SEABs 202 and the MEABs 204. Additionally, a block of data stored in MRAM 206 can be accessed faster than storing the block of data in multiple SEABs 202 or MEABs 204. MRAM 206 can also be used as an on-chip cache and/or a scratch pad memory with PLD 100 for storing large amounts of data. This has the advantage of allowing a user of PLD 100 to access the memory faster than going off-chip to access a separate memory device.

Similar to the differences in their sizes, it should be noted that the functional distinctions described above for SEABs 202, MEABs 204, and NRAM 206 are somewhat arbitrary and can vary depending on the application. For example, in some applications, SEABs 202, MEABs 204, and MRAM 206 can be used to perform essentially the same functions.

Although the present embodiment of PLD 100 is depicted and described as having three distinct sizes of embedded memory, it should be recognized that PLD 100 can include two distinct sizes of embedded memory rather than three. For example, PLD 100 can include a combination of two of the three distinct sizes of memory mentioned above (i.e., SEAB 202, MEAB 204, and MRAM 206). Additionally, PLD 100 can include more than three distinct sizes of memory.

As depicted in FIG. 2, in the present embodiment, PLD 100 is configured with multiple columns of SEABs 202 and MEABs 204. More particularly, PLD 100 is depicted as having 6 columns, 27 rows of SEABs 202 and 2 columns, 27 rows of MEABs 204. In contrast, PLD 100 is depicted as having a single MRAM 206. As mentioned earlier, it should be recognized, however, that PLD 100 can include any number of SEABs 202, MEABs 204, and MRAMs 206. For example, FIG. 2 can be viewed as depicted just a portion, such as a single quadrant, of PLD 100.

As further depicted in FIG. 2, similar to LABs 102, SEABs 202 and MEABs 204 are connected to H-lines 104 and V-lines 106. As such, SEABs 202 and MEABs 204 can be accessed in the same manner as LABs 102 through the routing architecture of PLD 100. It should be noted, however, that PLD 100 can be configured with any number of SEABs 202 and MEABs 204, including just one of each, in various configurations.

In contrast to SEABs 202 and MEABs 204, FIG. 2 depicts MRAM 206 spanning multiple H-lines 104 and V-lines 106. As such, in the present embodiment, PLD 100 includes interface regions configured to interface MRAM 206 into the routing architecture of PLD 100.

Figure 3:
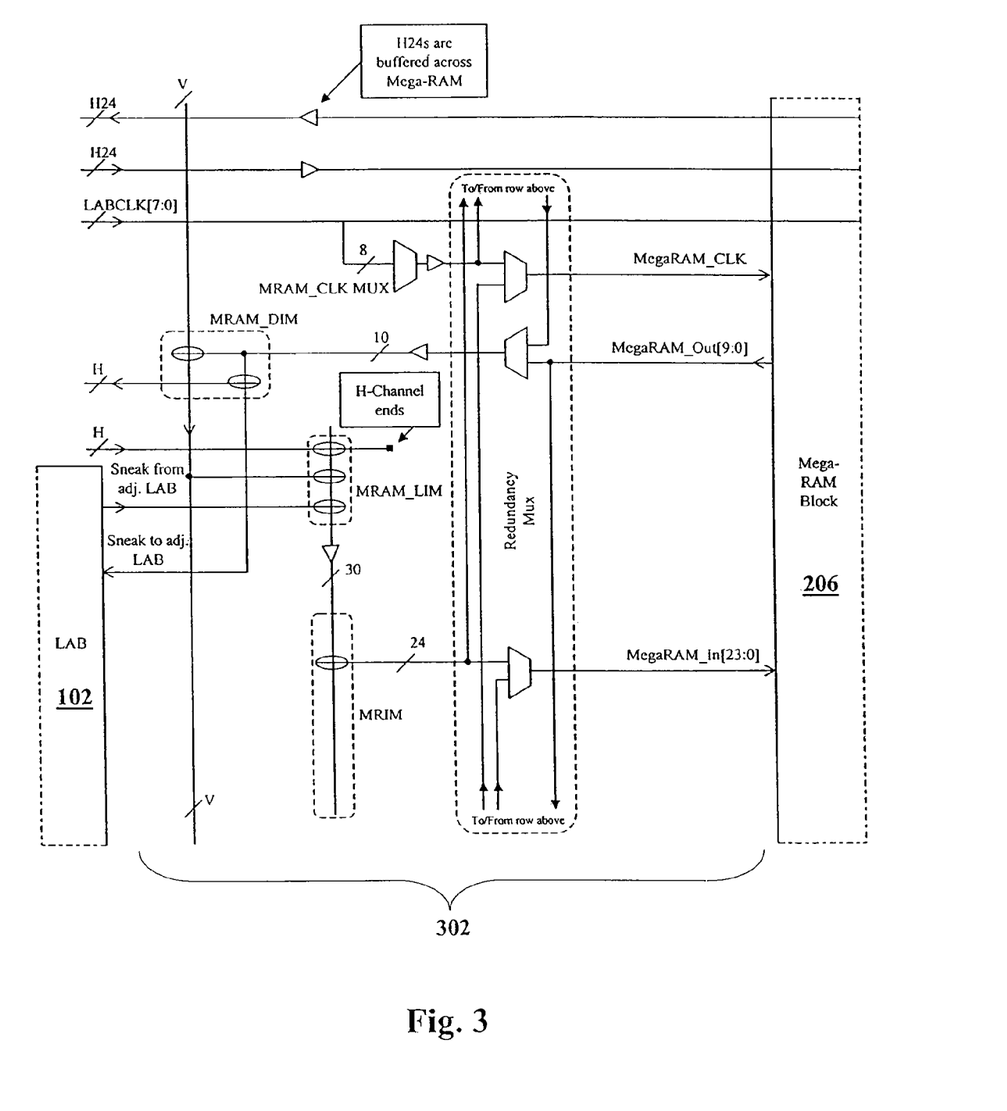
FIG. 3 is a portion of the PLD depicted in FIG. 2.
Figure 4:
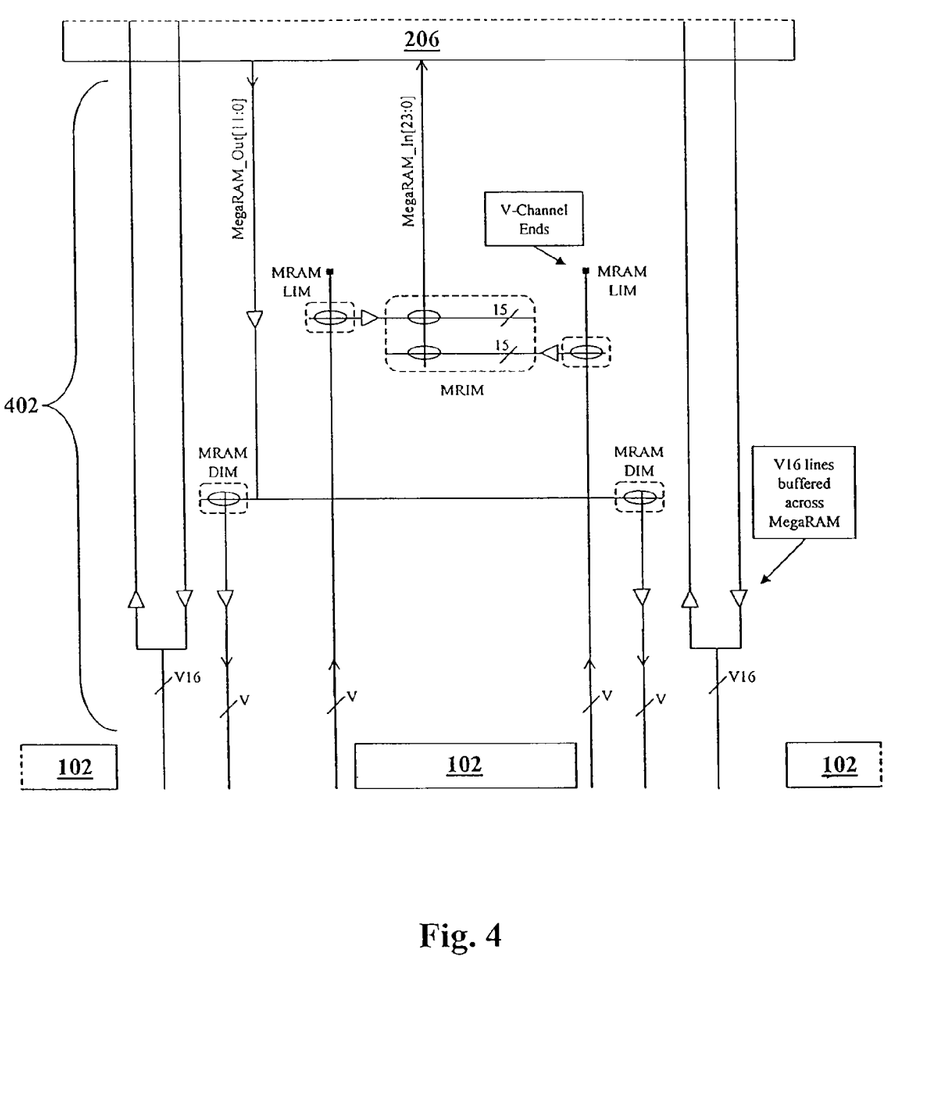
FIG. 4 is another portion of the PLD depicted in FIG. 2.

More particularly, in one preferred embodiment, MRAM 206 can be bordered on solely one, two, or three sides by an interface region. As an example, FIG. 3 depicts a portion of an interface region along what is depicted as being the vertical side of MRAM 206, and FIG. 4 depicts a portion of an interface region along what is depicted as being the horizontal side of MRAM 206. As depicted in FIG. 2, MRAM 206 spans multiple columns and multiple rows of LABs 102, and therefore interfaces with many lines ("channels") of routing lines. In the present embodiment, some of these routing lines do not cross MRAM 206. Rather, some of the routing lines "dead ends" at the interface regions. More particularly, the H4, H8, V4, and V8 lines dead end at the interface regions, while the H24 and V16 lines cross MRAM 206.

In the portion of the interface regions depicted in FIGS. 3 and 4, the H24 (FIG. 3) and V16 (FIG. 4) routing lines are buffered across MRAM 206. With reference to FIG. 3, MRAM interface 302 connects MRAM 206 to an adjacent row. With reference to FIG. 4, MRAM interface 402 connects MRAM 206 to a pair of adjacent columns. One MRAM interface is provided for every row and every pair of columns that MRAM 206 spans. For a more detailed description of the interface regions, see co-pending U.S. application Ser. No. 10/057,442, titled PLD ARCHITECTURE FOR FLEXIBLE PLACEMENT OF IP FUNCTION BLOCKS, filed on Jan. 25, 2002, the entire content of which is incorporated herein by reference.

The memory interface circuit shown in FIGS. 3 and 4 allow memory blocks that are near each other to be combined or chained together to form a larger memory. For example, the redundancy mux shown in FIG. 3 provides and receives signals to and from memories in adjacent rows. In this specific example, MRAMS in adjacent rows can be combined to form a larger memory. In this way, a memory larger than the largest individual memory may be formed. Also, SEABs and MEABs can be combined to form different size memories.

The above embodiments of the present invention provide a range of memory sizes that may be used to store data by either users or applications running on a PLD or FPGA. On occasion, however, even the smallest memory included dedicated memory is larger than what is needed. This is particularly true if a MEAB is the smallest included memory. If a MEAB is used in such a situation, memory capacity may be wasted. In this case, one or more memories, referred to a lookup tables, in logic elements on an FPGA can be used to form a distributed memory. These distributed memories, as with the other memories, may be written to and read from by users or applications running on a PLD or FPGA.

While each logic element used as memory is a logic element that cannot be used as to implement a logic function, the use of logic element lookup tables provides several advantages over SEABs or other dedicated memory. For example, in a specific embodiment of the present invention, every logic element in a logic array block 102 can be used as distributed memory. The cumulative size of the resulting memory rivals that of a SEAB. In one embodiment of the present invention, SEABs are replaced by this type of logic array block 102. While extra die area is used as compared to a dedicated SEAB, such a logic array block can be used as either logic or as memory. In this specific embodiment, some logic array blocks 102 may be used as memories. Since this flexibility requires additional logic that uses die area and slows circuit operation, other logic array blocks 102 cannot be configured as memories, though in other embodiments of the present invention, all logic array blocks 102 can be used as memories.

While in the above example, lookup tables are configured as memory on a logic array basis, a finer granularity can be used in determining which lookup tables are used as distributed memory. In another embodiment of the present invention, some logic elements in a logic array block can be used as distributed memories, while others are not. Also, embodiments of the present invention may incorporate two types of logic elements, one having a lookup table that may be used as distributed memory, and another having a lookup table that is dedicated, and cannot be used for distributed memory. In these and other embodiments of the present invention, the use of logic element lookup tables allow data to be stored very close to the circuitry that utilizes the data, thereby providing easy access to stored data. This can conserve valuable routing resources for other purposes.

The lookup tables in logic elements may be used as individual distributed memories, or they may be linked together to form larger distributed memories. Alternately, the lookup tables used as memories may be linked together with one or more of the memories described above, for example, the SEABs, MEABs, or MRAMs, to form a larger memory.

The logic elements on a PLD or FPGA can be configured in myriad ways to generate a wide variety of logic circuits. This is achieved using configuration bits. Configuration bits are stored in memory and are used to open and close switches such that the logic elements are configured to implement user-defined logic functions. Thus, if a lookup table in a logic element is used as a distributed memory, or as part of a distributed memory, the configuration memory locations that would otherwise be used to store configuration bits are freed up and not used. Accordingly, these configuration memory locations may also be used to store data. As before, these configuration memory locations may be used separately or in conjunction with lookup table memories, SEABs, MEABs, MRAMs, or any of the other memories described here.

Also, once a PLD is configured, some or all of the PLD may be reconfigured at a later time, for example, after a specific result or data has been generated. Accordingly, at such a time, one or more logic elements may be reconfigured from operating as a distributed memory to operating as a logic element. Similarly, one or more logic elements may be reconfigured from operating as a logic element to operating as a distributed memory. An example of a logic element having a lookup table is shown in the following figure.

Figure 5:
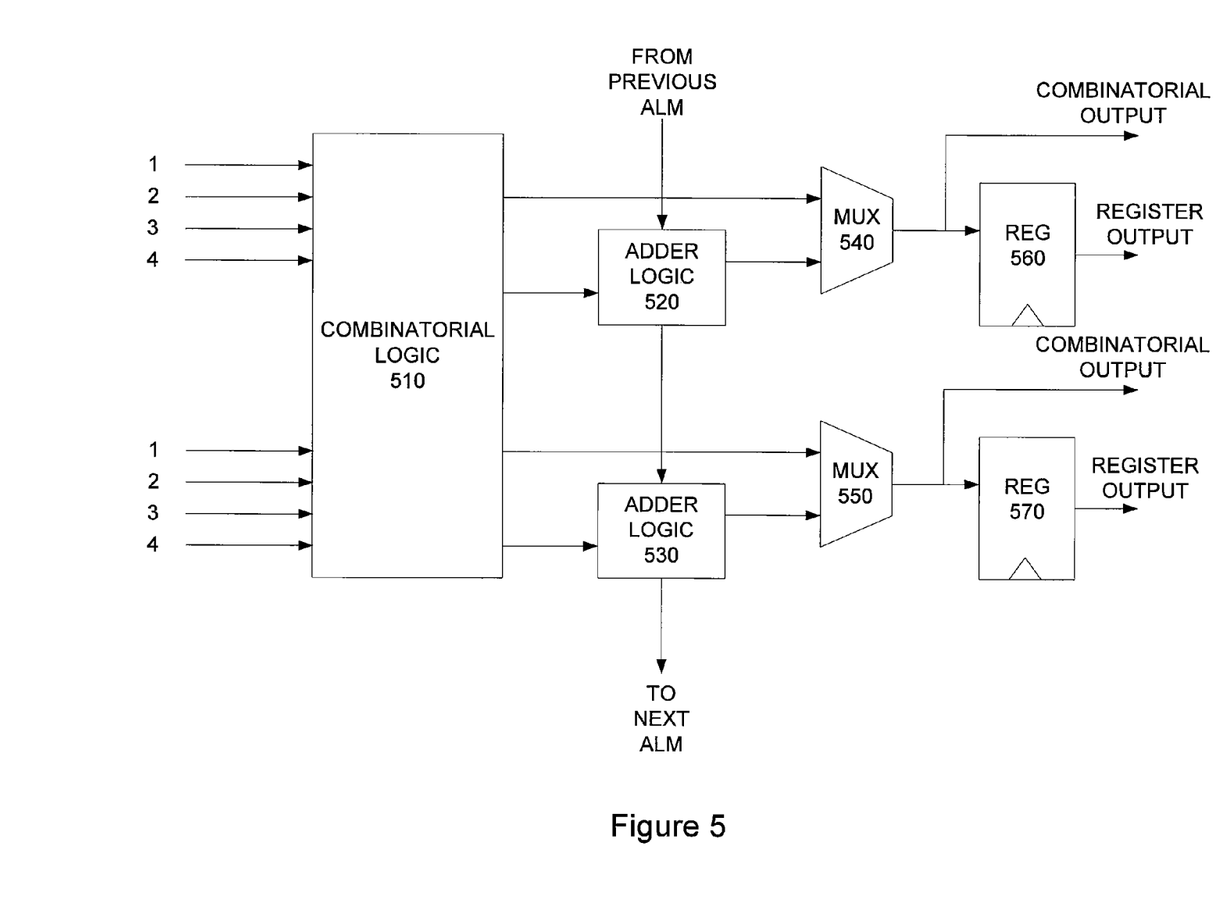
FIG. 5 illustrates an adaptive logic module having a lookup table that may be used as a distributed memory according to an embodiment of the present invention.

FIG. 5 illustrates an adaptive logic module having a lookup table that may be used as distributed memory according to an embodiment of the present invention. This logic element includes combinatorial logic 510, adders 520 and 530, multiplexers 540 and 550, and registers 560 and 570. This figure, as with of the other included figures, is shown for illustrative purposes only and does not limit either the possible embodiment of the present invention or the claims.

In this particular example, two sets of four inputs are received by the combinatorial logic 510. In a specific embodiment of the present invention, the combinatorial logic 510 is formed using two adaptive lookup tables. These adaptive lookup tables may be combined or kept separate to achieve several configurations. For example, the two adaptive lookup tables may be combined to form one lookup table having seven inputs. Alternately, they may be combined to form one lookup table having six inputs. Other configurations, such as lookup tables having five and three inputs, to two lookup tables having four inputs are also possible.

In this specific embodiment, each lookup table has 16 memory locations to support the 4 input signals. In other embodiments of the present invention, other types of lookup tables, such as lookup tables that are not adaptive, can be used. Also, these may have different numbers of memory cells to support different numbers of input signals. In various embodiments of the present invention, one or both of the adaptive lookup tables in the combinatorial logic 510 may be used as distributed memory, for example, one may be used as distributed memory while the other is used as a lookup table. In other embodiments, both are either used as distributed memory or as logic element lookup tables.

The use of a lookup table as a distributed memory for data storage differs from its use as a lookup table for implementing logic functions. When a lookup table is used as a distributed memory, users or applications can write data to it, store data in it, and read data from it. In practice, this is done using other logic elements or other specialized circuits. When a lookup table is used to implement a logic function, the lookup table is loaded during configuration such that an output consistent with the logic function is provided for each possible input combination.

The outputs of the combinatorial logic 510 are received by the adder logic circuits 520 and 530. These adder logic circuits 520 and 530 provide the ability to combine logic in arithmetic operations in a single logic level. Combinatorial and arithmetic outputs are multiplexed by multiplexers 540 and 550, which provide outputs to registers 560 and 570. The adaptive logic module provides two sets of two outputs, a registered and non-registered version.

Again, several configuration bits are used to configure the adaptive logic module shown here. For example, configuration bits are used to control the selection of inputs by multiplexers 540 and 550, while others are used to determine the configuration of the combinatorial logic 510. In various embodiments of the present invention, one adaptive lookup table in the combinatorial logic 510 may be used as a lookup table, while the other is used for a distributed memory. If one or both of the adaptive lookup tables are used for distributed memory, their configuration bits are not needed. Accordingly, various embodiments of the present invention allow the configuration bit memory locations that are not needed to configure the lookup table used for a distributed memory (and its related circuitry) to be used for data storage.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
   an array of logic elements configurable to implement user-defined logic functions, each logic element including a lookup table, wherein at least one logic element lookup table is further configurable for use as a distributed memory for data storage;
   a first memory block having a first set of control logic and circuits, the first memory block disposed within the array of logic elements; and
   a second memory block having a second set of control logic and circuits, the second memory block disposed within the array of logic elements,
   wherein the first and second memory blocks have different memory sizes.

2. The integrated circuit of claim 1 wherein each logic element lookup table in a logic array block is used to form a distributed memory for data storage.

3. The integrated circuit of claim 1 further comprising a configuration memory location, wherein the configuration memory location is used for data storage.

4. The integrated circuit of claim 1 wherein the first memory block is one memory block in a column of memory blocks, each having the same size.

5. The integrated circuit of claim 4 wherein two of the memory blocks in the column of memory blocks can be combined to form a larger memory.

6. The integrated circuit of claim 4 wherein a memory block in the column of memory blocks can be combined with a logic element lookup table to form a larger memory.

7. The integrated circuit of claim 1 further comprising a third memory block having a third set of control logic and circuits, the third memory block disposed within the array of logic elements,
   wherein the first, second, and third memories have different sizes.

8. The integrated circuit of claim 1 wherein the first memory block has a configurable width and a configurable depth.

9. An integrated circuit comprising:
   an array of logic elements arranged in a plurality of logic array blocks and configurable to implement user-defined logic functions, each logic element including at least one lookup table that may be used to form a distributed memory for data storage;
   a first embedded memory block disposed within the array of logic elements; and
   at least a second embedded memory block disposed within the array of logic elements,
   wherein the first memory block has greater memory size than the second embedded memory block.

10. The integrated circuit of claim 9 wherein each logic element lookup table in at least one logic array block can be used to form a distributed memory for data storage.

11. The integrated circuit of claim 9 further comprising a configuration memory location, wherein the configuration memory location is used for data storage.

12. The integrated circuit of claim 9 wherein the first embedded memory block is one memory block in a column of memory blocks, each having the same size, where adjacent memory blocks in the column of memory blocks can be combined to form a larger memory.

13. The integrated circuit of claim 9 further comprising a third embedded memory block, the third embedded memory block disposed within the array of logic elements,
wherein the first, second, and third embedded memory blocks have different sizes.

14. The integrated circuit of claim 1 wherein the first embedded memory block has a configurable width and a configurable depth.

15. An integrated circuit comprising:
a plurality of programmable logic elements arranged in a plurality of rows and columns and configurable to implement user-defined logic functions, at least one logic element including a lookup table further configurable to implement a distributed memory for data storage;
a first embedded memory coupled to a first set of the plurality of programmable logic elements, the first embedded memory having a first size; and
a first plurality of columns of second embedded memories, each second embedded memory having a second size,
wherein the first size is larger than the second size.

16. The integrated circuit of claim 15 further comprising:
a second plurality of columns of third embedded memories, each third embedded memory having a third size,
wherein the second size is larger than the third size.

17. The integrated circuit of claim 15 wherein adjacent second embedded memories can be combined to form larger memories.

18. The integrated circuit of claim 15 wherein a second embedded memory can be combined with a lookup table in a logic element to form a larger memory.

19. The integrated circuit of claim 15 wherein each logic element lookup table in a logic array block can be used to form a distributed memory for data storage.

20. The integrated circuit of claim 15 wherein the integrated circuit is a field programmable gate array.

* * * * *